United States Patent [19]

Jackson

[11] Patent Number: 4,458,165
[45] Date of Patent: Jul. 3, 1984

[54] PROGRAMMABLE DELAY CIRCUIT

[75] Inventor: Ronald M. Jackson, Portland, Oreg.

[73] Assignee: Tektronix, Inc., Beaverton, Oreg.

[21] Appl. No.: 478,606

[22] Filed: Mar. 23, 1983

[51] Int. Cl.$^3$ .............................................. H03H 7/30
[52] U.S. Cl. ..................................... 307/595; 307/603; 328/129.1; 333/138
[58] Field of Search ....................... 307/593, 595, 603; 328/129; 333/138

[56] References Cited

U.S. PATENT DOCUMENTS

| | | | |
|---|---|---|---|
| 3,862,406 | 1/1975 | Brooks .............................. | 307/595 X |
| 4,016,511 | 4/1977 | Ramsey et al. .................. | 307/603 X |
| 4,017,747 | 4/1977 | Sheng ............................ | 328/129.1 X |

Primary Examiner—E. A. Goldberg
Assistant Examiner—Derek Jennings
Attorney, Agent, or Firm—John Smith-Hill

[57] ABSTRACT

A programmable delay circuit comprises input and output multiplexers, a delay device provided between the multiplexers, and a negative feedback path. When the input multiplexer selects an input logic signal, the delay time is controlled by the output multiplexer. When the input multiplexer selects the feedback path, the delay circuit acts as a ring oscillator for generating a square-wave signal whose period is twice the selected delay time. Additional delay devices and multiplexers may be provided between the input and output multiplexers.

11 Claims, 4 Drawing Figures

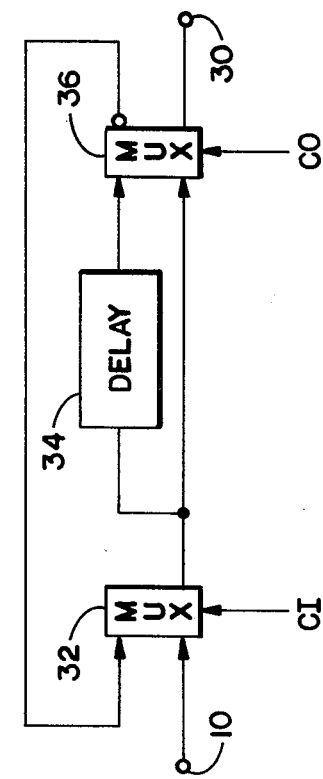
FIG_2_
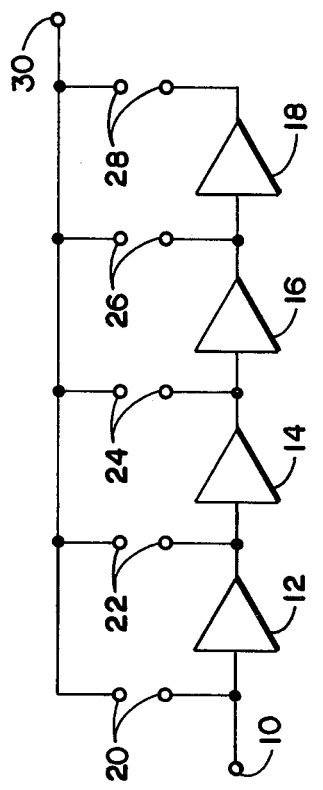
FIG_1_
(PRIOR ART)
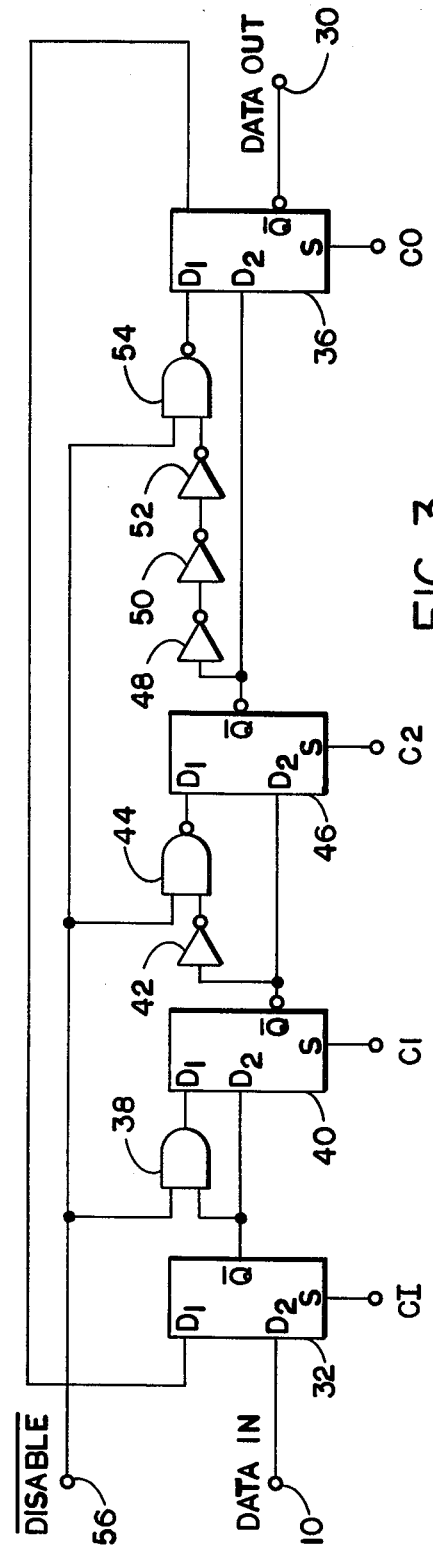
FIG_3_

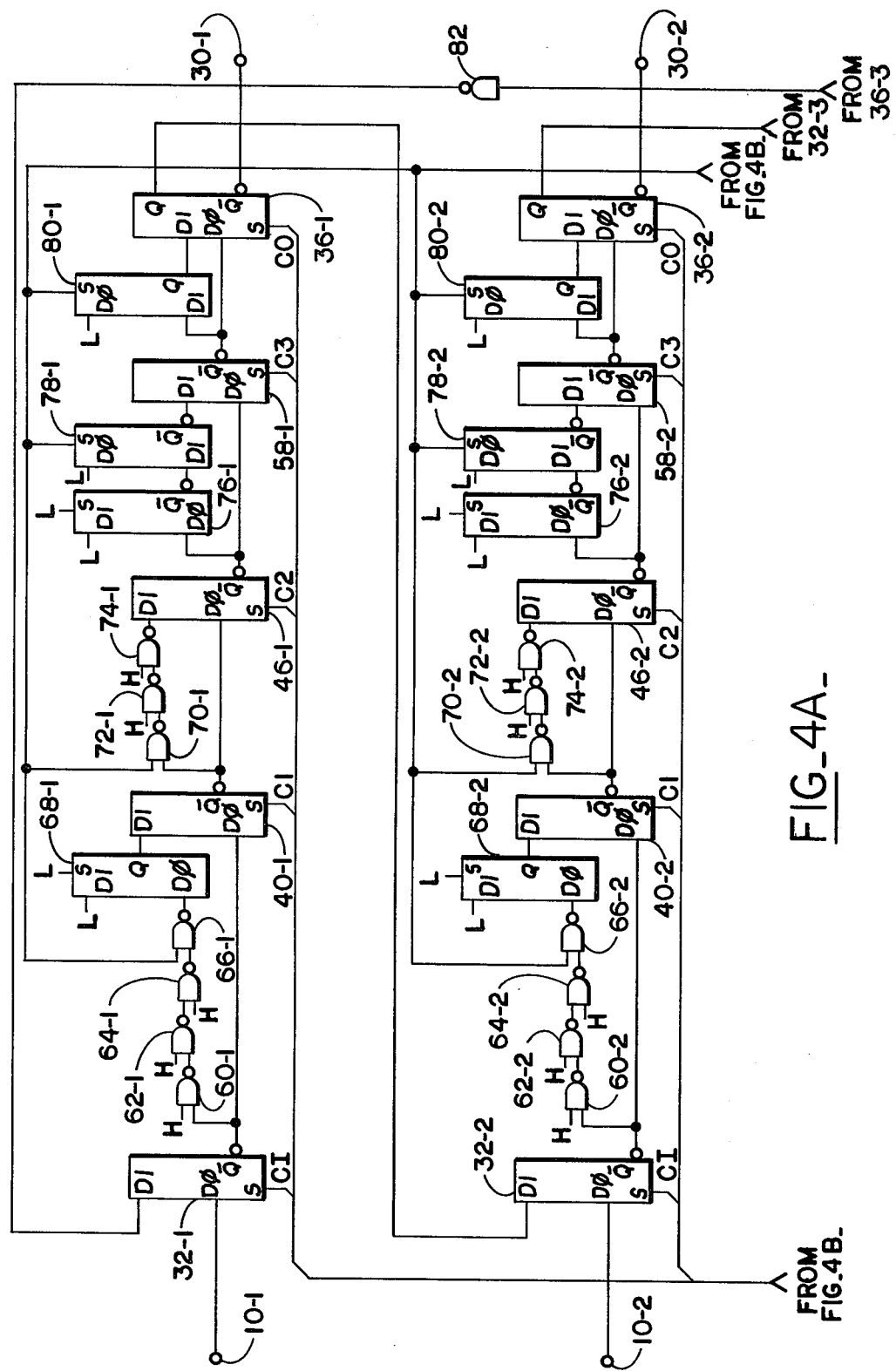
FIG_4A_

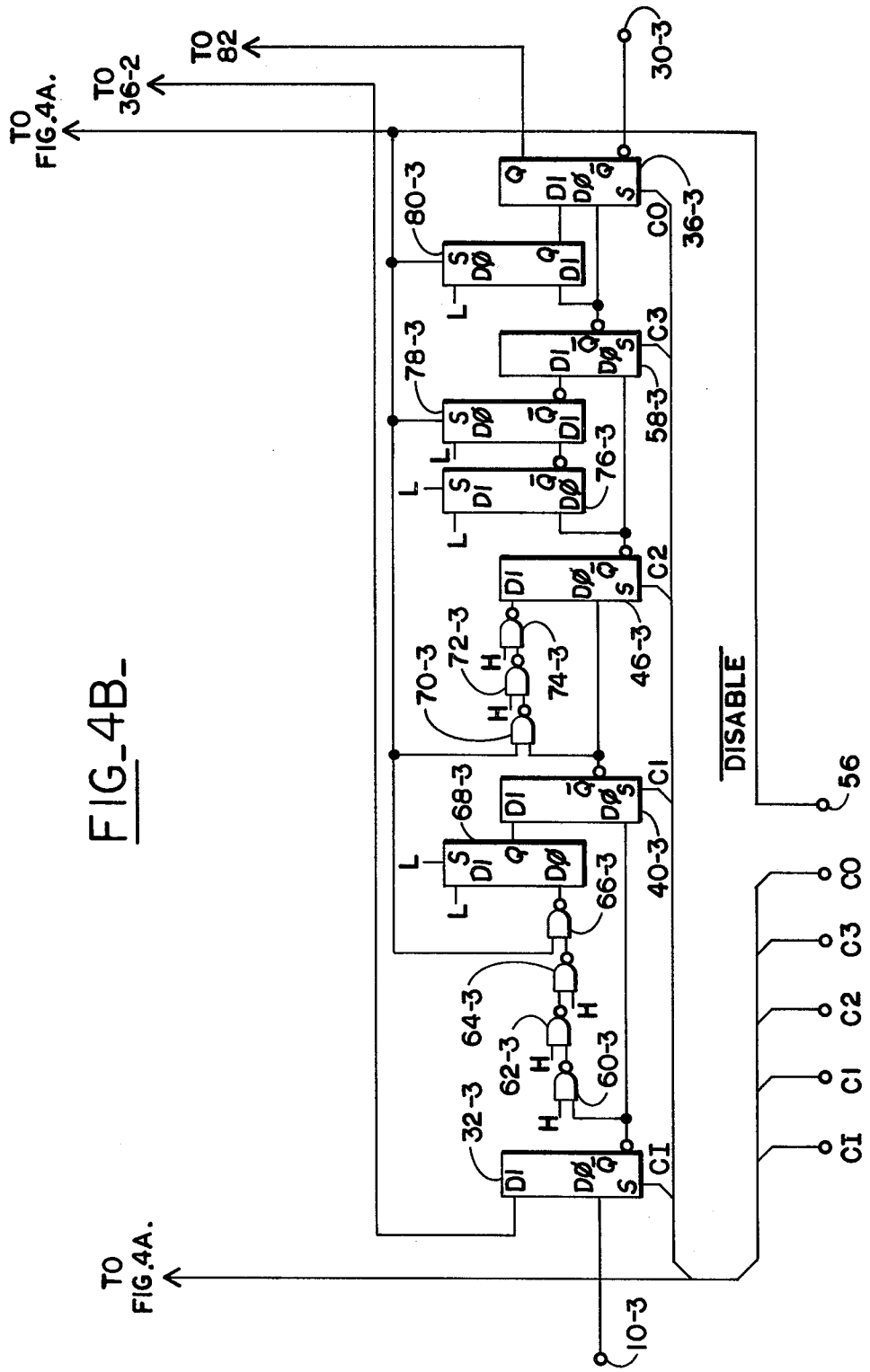
FIG_4B

PROGRAMMABLE DELAY CIRCUIT

The present invention relates to a delay circuit for delaying a logic signal by a predetermined time which can be digitally programmed.

BACKGROUND OF INVENTION

In logic circuits, timing of logic (digital) signals is very important. When a logic signal is applied to a logic circuit through a signal path, the delay time of the signal path must be stable in order for the logic circuit to operate properly. When a plurality of logic signals are transmitted, the delay times of the signal paths must be equal to each other for maintaining the timing relation of the logic signals. In logic measurement instruments such as logic analyzers, the correct timing relation of a plurality of logic signals cannot be measured, if the delay time of each signal path is different, i.e. if the skew time of each logic signal is different. However, the delay time of the signal path is not constant and stable, since it depends on the length of the path, the propagation delay times of logic devices (ICs) in the signal path, etc. In particular, the propagation delay times of logic devices are affected by production variations, and vary in accordance with temperature Therefore, a variable delay circuit is necessary to adjust the delay time of the signal path. Many variable delay circuits have been proposed, and one of them is shown in FIG. 1. Four individual delay devices comprising buffer ICs 12 through 18 are connected in series, and the input of the buffer 12 is connected to the input terminal 10 of the delay circuit. Terminal pairs 20 through 28 are connected between the input/output of each buffer and the output terminal 30 of the delay circuit. Delay lines may be used for the delay devices instead of buffers 12 through 18. The delay time of this variable delay circuit is adjusted by selectively shorting one of terminal pairs 20 through 28. However, it is troublesome to change the delay time frequently, since the previously shorted terminal pair must be opened before shorting another terminal pair. Moreover, the delay time cannot be controlled remotely, and it is not easy to measure the delay time because the timing relation of logic signals at the input and output terminals 10 and 30 must be measured. Another conventional variable delay circuit employs mechanical switches instead of terminal pairs 20 through 28 of FIG. 1. However, the switches are cumbersome, an the disadvantages of FIG. 1 are not improved.

SUMMARY OF THE INVENTION

According to the present invention there is provided a programmable delay circuit, comprising a delay device having an input port and an output port, and a multiplexer having a first input port connected to the input port of the delay device, a second input port connected to the output port of the delay device, and an output port, said multiplexer being operative to connect selectively either the first input port or the second input port of the multiplexer to the output port, thereof, whereby the circuit can be programmed and provide delay time from the input port of the delay device to the output port of the multiplexer either including or excluding the propagation delay of the delay device.

A preferred embodiment of the invention comprises at least one delay device such as a logic gate, buffer and delay line, and a plurality of multiplexers. An input multiplexer selects an input logic signal or a feedback logic signal, and the output logic signal therefrom is applied to both the delay device and a direct (non-delay) signal path. The output multiplexer selects the delay device or the direct signal path, and a part of the output therefrom is a feedback signal. It should be noted that this feedback is negative. When the input multiplexer selects the input logic signal (delay mode), the delay time depends on the selection of the output multiplexer. If the output multiplexer selects the delay device, the delay time is the total of the propagation delay times of the delay device and the input and output multiplexers. If the output multiplexer selects the direct signal path, the delay time is the total of the propagation delay times of the input and output multiplexers. Since the multiplexers are controlled by logic signals, the variable delay circuit can be programmed and controlled remotely. When the input multiplexer selects the negative feedback signal (oscillation mode), the variable delay circuit operates as a ring oscillator generating a square wave signal whose period is twice the total delay time of the variable delay circuit. Therefore, the delay time can be measured easily by measuring the frequency or period of the square wave. Additional delay devices and multiplexers may be inserted between the input and output multiplexers for increasing the dealy time selections.

BRIEF DESCRIPTION OF THE DRAWINGS

For a better understanding of the invention, and to show how the same may be carried into effect, reference will now be made, by way of example, the accompanying drawings in which:

FIG. 1 is a circuit schematic of a conventional variable delay circuit;

FIG. 2 is a circuit schematic of a first embodiment of the present invention;

FIG. 3 is a circuit schematic of a second embodiment of the present invention; and FIGS. 4A and 4B illustrate respective portions of a circuit schematic of a third embodiment of the present invention.

DETAILED DESCRIPTION

Referring to FIG. 2, there is shown a first embodiment of the present invention. An input multiplexer 32 selects either an input logic signal at input terminal 10 or a feedback logic signal from an output multiplexer 36 in accordance with a logic control signal CI, and the non-inverted output signal from the multiplexer 32 is applied to the output multiplexer 36 both directly and through a delay device 34. The output multiplexer 36 selects either the delay device 34 or the direct signal path from the input multiplexer 32 in accordance with a logic control signal CO. The non-inverted output multiplexer 36 is connected to output terminal 30, and the inverted output thereof is connected to input multiplexer 32 for applying the feedback signal. It should be noted that this feedback is negative, since the delay device is 34 is a non-inverting device. The delay device 34 may be a logic gate, buffer, delay line, C-R or L-R network.

In the delay mode, the control signal CI causes the multiplexer 32 to select the input logic signal. The delay time of the circuit of FIG. 2 is adjusted by the control signal CO. If the multiplexer 36 selects the delay device 34, the multiplexers 32 and 36 and the delay device 34 are inserted between the input and output terminals 10 and 30, and the delay time is determined by the propagation delay times of the inserted devices. If the multiplexer 36 selects the direct path, only the multiplexers 32 and 36 are inserted between the input and output terminals 10 and 30, and the delay time is determined by the total propagation delay times of the multiplexers 10 and 30.

In the oscillation mode, the multiplexer 32 selects the feedback signal to form a ring oscillator. A square-wave signal is derived at the output terminal 30, and the period thereof is twice the total delay time. Therefore, the actual delay time selected by the control signal C0 can be measured easily by measuring the frequency or period of the square-wave signal at the terminal 30.

Since the multiplexers 32 and 36 can be controlled with DC levels (logic signals), the delay circuit of the present invention is programmable and can be controlled remotely. If the delay device 34 is a logic gate or buffer, all components of the present invention can be formed in an IC such as a gate array IC and thereby the programmable delay circuit may be compact in construction. The feedback signal may be derived from the output terminal 30, if an inverter is inserted into the feedback path or the delay device 34 is an inverting device.

FIG. 3 illustrates a second embodiment of the preset invention. In this embodiment, there are two multiplexers and seven delay devices between the input and output multiplexers 32 and 36. The delay devices are an AND gate 38, NAND gates 44 and 54, and inverters 42, 48, 50 and 52. The AND gate 38 is inserted between the multiplexers 32 and 40, the inverter 42 and the NAND gate 44 are inserted between the multiplexers 40 and 46, and the inverters 48 through 52 and the NAND gate 54 are inserted between the multiplexers 46 and 36. Respective inputs of the gates 38, 44 and 54 are connected to a terminal 56 to receive a disable signal (DISABLE). This disable signal aids in testing the circuit. It should be noted that the inverting outputs from all the multiplexers are used in order to compensate for differences in propagation speeds for rising and falling edges of the logic signal. The logic level at terminal 56 is normally "High". The control signal CI selects the delay or oscillation mode, and the control signals C0, C1 and C2 adjust the delay time, wherein the signals C1 and C0 correspond to the LSB and MSB of the logic control signal respectively. All devices in FIG. 3 may be formed in an IC.

FIGS. 4A and 4B illustrate a circuit schematic of a third embodiment of the present invention. This embodiment includes three signal delay paths wherein each delay path includes input and output multiplexers 32, 34 and 36, NAND gates 60 through 66 and 70 through 74 operating as delay devices, multiplexers 68, 76, 78 and 80 operating as delay devices, and multiplexers 40, 46 and 58 operating as delay time selectors. The NAND 60, 62, 64, 72 and 74 each receive a "High" at one input and thus operate as inverters and multiplexers 68 and 76 each receive a "Low" at the selection terminal S and the input terminal D1 so that they always select the input D0. The NAND gates 66 and 70 and multiplexers 78 and 80 receive the disable signal from the terminal 56. When the disable signal is "High", the NAND gates 66 and 70 are enabled, and the multiplexers 78 and 80 select the inputs D1. When the disable signal is "Low", the delay paths are off, because the NAND gates 66 and 70 are disabled and the multiplexers 78 and 80 select the input D0. The non-inverting output Q of the multiplexer 36-1 is connected to the input D1 of the multiplexer 32-2, the non-inverting output Q of the multiplexer 36-2 is connected to the input D1 of the multiplexer 32-3, and the non-inverting output Q of the multiplexer 36-3 is connected to the input D1 of the multiplexer 32-1 through the NAND gate (inverter) 82. Similarly to the embodiment of FIG. 3, the control signal CI selects one of the delay and oscillation modes, and the control signals C0 through C3 adjust the delay time, wherein the signals C0 and C1 are LSB and MSB of the logic control signal. Since this embodiment employs the NAND gates and multiplexers as delay devices, many combinations of delay times are available.

In the delay mode, the control signal CI is "Low" so that the multiplexers 32 select the input terminals 10. Thus, each delay path operates independently. the delay time is controlled by the signals C0 through C3. In the oscillation mode, the multiplexers 32 select the inputs D1 and the three delay paths are connected in a single closed loop to form the ring oscillator. The frequency or period of the square-wave signal depends on the total delay time of the three delay paths. Since the delay times of the several delay paths are equal to each other and the total delay time is three times the delay time of each individual delay path, the oscillation frequency is low. Thus, it is easy to measure the frequency. As shown, the FIGS. 4A and 4B circuit controls the three delay paths in common, but, each delay path may be controlled independently of the others, in which case three logic signals having different skew times can be matched with each other. All the logic devices in FIGS. 4A and 4B may be formed in an IC.

As will be understood from the foregoing description, the present invention may be used to provide a programmable delay circuit, the delay time of which can be adjusted digitally and remotely. Since the circuit can act as a ring oscillator, it is easy to measure the delay time. Moreover, all components can be formed in an IC.

It will be appreciated that the invention is not restricted to the circuits which have been described and illustrated, since variation may be made thereon without departing from the scope of the invention as defined in the appended claims, and equivalents thereof. For example, latch circuits may be provided for the logic control signals and the disable signal.

I claim:

1. A programmable delay circuit, comprising a delay device having an input port and an output port, and a multiplexer having a first input port connected to the input port of the delay device, a second input port connected to the output port of the delay device, and an output port, said multiplexer being operative to connect selectively either the first input port or the second port of the multiplexer to the output port, thereof, whereby the circuit can be programmed and provide delay time from the input port of the delay device to the output port of the multiplexer either including or excluding the propagation delay of the delay device.

2. A circuit according to claim 1, comprising an input device having a first input port for receiving an input signal, an output port connected to the input port of the delay device, and a second input port, said input device being operative to connect selectively either of its input ports to its output port, the second input port of the input device being connected to receive a negative feedback signal from the multiplexer, whereby the circuit functions as a ring oscillator generating a rectangular wave signal having a period equal to twice the delay of the circuit when the input device connects its second input port to the output port.

3. A circuit according to claim 2, wherein the delay device provides a non-inverted output.

4. A circuit according to claim 2, wherein the delay device provides an inverted output.

5. A circuit according to claim 1, wherein said delay device is a gate having a first input port connected to the output port of the input device and also having a second input port to which a disable signal may be applied.

6. A circuit according to claim 5, wherein said delay device is a device selected from the group consisting of an AND gate, a NAND gate and a multiplexer.

7. A circuit according to claim 1, wherein said delay device is a device selected from the group consisting of a buffer and an inverter.

8. A circuit according to claim 1, comprising a second delay device having an input port connected to the output port of the multiplexer and also having an output port, and a second multiplexer having a first input port connected to the output port of the second delay device, a second input port connected to the output port of the first-mentioned multiplexer, and an output port, said second multiplexer being operative to connect selectively either its first input port or its second input port to its output port, whereby the circuit can be programmed to provide a delay time either including or excluding the propagation delay of the second delay device.

9. A circuit according to claim 8, comprising an input device having a first input port for receiving a logic signal, an output port connected to the input port of the first-mentioned delay device, and a second input port, said input device being operative to connect selectively either of its input ports to its output port, the second input port being connected to receive a negative feedback signal from the second multiplexer, whereby the circuit functions as a ring oscillator having a period equal to twice the delay of the circuit when the input logic device connects its second input port to its output port.

10. A circuit according to claim 8, wherein the second delay device is a gate having a first input port connected to the output port of the first-mentioned multiplexer and also having a second input port to which a disable signal may be applied.

11. A circuit according to claim 10, wherein said second delay device is a device selected from the group consisting of an AND gate, a NAND gate and a multiplexer.

* * * * *